United States Patent [19]

Matsumoto et al.

[11] Patent Number: 5,067,905
[45] Date of Patent: Nov. 26, 1991

[54] ELECTRIC CONNECTION BOX

[75] Inventors: Etsuji Matsumoto; Mamoru Araki; Keiichi Ozaki, all of Shizuoka, Japan

[73] Assignee: Yazaki Corporation, Tokyo, Japan

[21] Appl. No.: 650,261

[22] Filed: Feb. 4, 1991

Related U.S. Application Data

[63] Continuation-in-part of Ser. No. 534,564, Jun. 7, 1990, Pat. No. 5,011,417.

[30] Foreign Application Priority Data

Jun. 9, 1989 [JP] Japan .................................. 1-145302
Feb. 20, 1990 [JP] Japan .................................. 2-37440

[51] Int. Cl.$^5$ ............................................. H01R 9/09
[52] U.S. Cl. .................................................... 439/76
[58] Field of Search ...................... 439/76, 78, 55, 81, 439/721, 251, 34; 361/395, 399, 407

[56] References Cited

U.S. PATENT DOCUMENTS

| | | | |
|---|---|---|---|
| 4,355,853 | 10/1982 | Kourimsky | 439/76 |
| 4,429,943 | 2/1984 | Inoue | 439/721 |
| 4,685,753 | 8/1987 | Isshiki et al. | 439/74 |
| 4,954,090 | 9/1990 | Shimochi | 439/78 |

Primary Examiner—Neil Abrams
Attorney, Agent, or Firm—Sughrue, Mion, Zinn, Macpeak & Seas

[57] ABSTRACT

An electric connection box including an insulative board having a plurality of through holes for a plurality of terminal holders formed on the lower case of the connection box. A plurality of bus bars are pressed relative to, and are mounted fixedly in bus bar mounting grooves in the insulative board so as to assemble a bus bar circuit board. This design compensates for possible slight precision defects in press-connecting pieces of the bus bars.

1 Claim, 6 Drawing Sheets

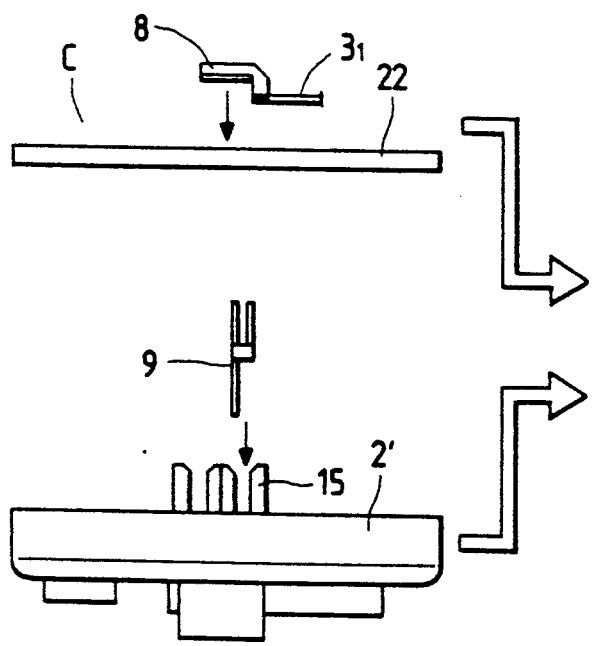
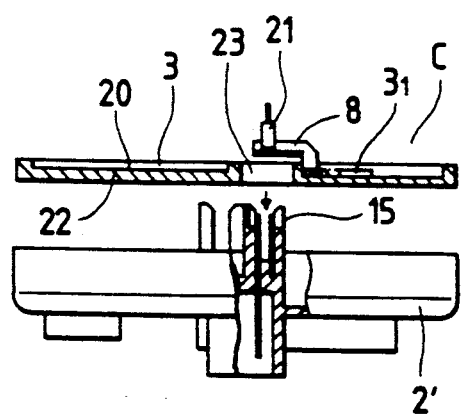
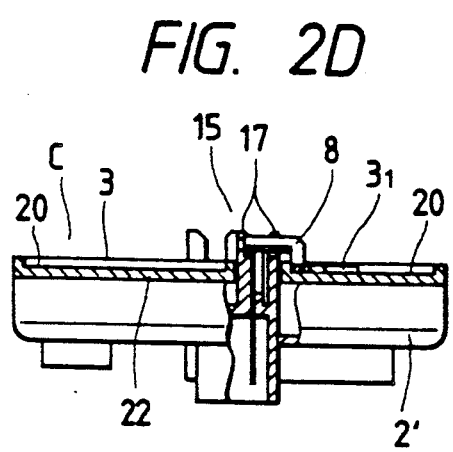
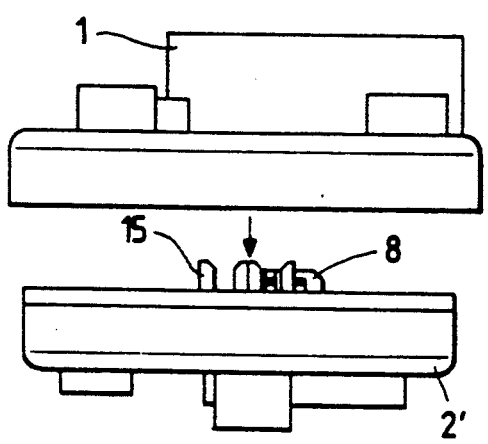

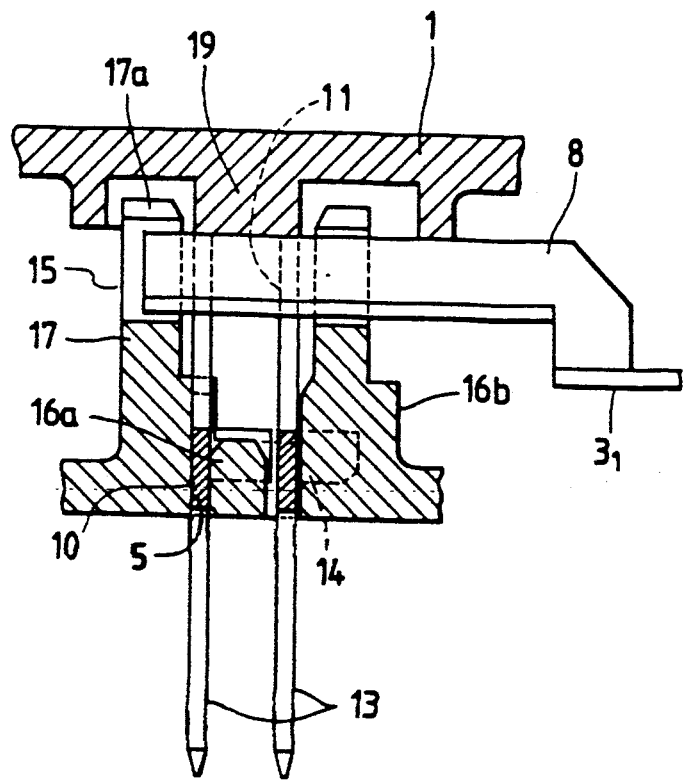
FIG. 5
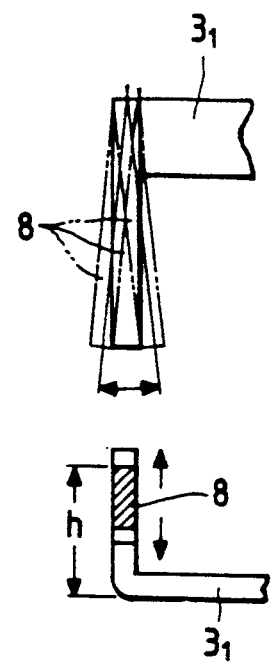
FIG. 7A
FIG. 7B
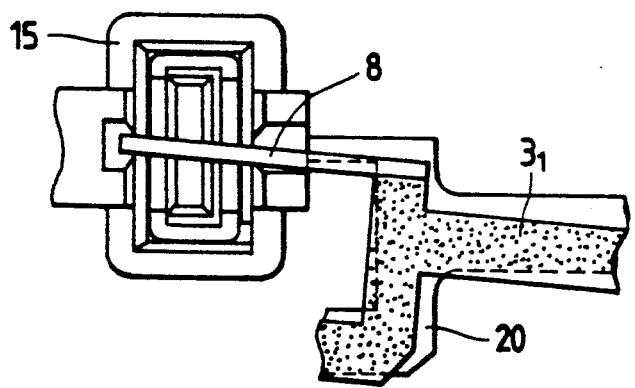
FIG. 8

ELECTRIC CONNECTION BOX

This is a continuation-in-part of Application No. 07/534,564, filed June 7, 1990, now U.S. Pat. No. 5,011,417.

BACKGROUND OF THE INVENTION

This invention relates to an electric connection box used to interconnect wire harnesses, for example.

One purpose of an electric connection box, such as a fuse box, a relay box, or a branch connection box, is to absorb a joint (branch connection) included in a wire harness.

For this reason, bus bars formed by pressing and bending a metal plate have been used conventionally as constituents of internal circuitry. Branch tabs (male terminals) can be formed integrally with the bus bar in an upstanding manner at desired positions of the bus bar, as for example at its end or at its intermediate portion, and the number of poles can be increased and decreased freely. However, it is not advisable to provide a number of tabs on each bus bar, because the adjacent bus bars interfere with each other, the arrangement of the bus bars becomes complicated, and the yield of stamping of the bus bars, as well as the density of arrangement of the bus bars, is lower.

In view of these deficiencies, the present applicant has proposed an electric connection box as shown in FIG. 3, which employs press-connecting terminals capable of press-connection to a bus bar. This electric connection box is the subject of copending, commonly assigned Application No. 07/534,564 now U.S. Pat. No. 5,011,417. The contents of that application are incorporated herein by reference.

In FIG. 3, a box shaped body of the electric connection box A is constituted by an upper case 1 and a lower case 2. A plurality of bus bars 3 and 3' are accommodated within the body. The bus bars 3' are wider, and have a greater current-carrying capacity than the bus bars 3.

Each bus bar has tabs 6 (6') directed upwardly or downwardly. Female-female relay terminals 7 (7') are attached to the tabs, and are led into a housing 4 of the upper case 1 (or the lower case 2) so as to form a connector insertion portion 4A for an external connector and a fuse insertion portion 4B. A bus bar $3_1$ has a bridge-like press-connecting piece 8 disposed in a plane perpendicular to a horizontal surface of the circuit of the bus bar. A press-connecting terminal 9 is connected to this piece 8.

As shown in FIG. 4 on an enlarged scale, the press-connecting terminal 9 is constituted by a base plate portion 10 defined by a U-shaped frame. Press-connecting portions 11, each having a U-shaped slot 12, are formed on one side of the base plate portion 10. A plurality of tabs 13 (four in the illustrated construction) project from the other side of the base plate portion 10. The opposite free ends of the base plate portion 10 are bent into an L-shape to form press-insertion pieces 14.

Bus bar-mounting grooves 20, arranged in a pattern corresponding to the pattern of arrangement of the plurality of the bus bars 3, are formed in the surface of the lower case 2. Terminal holders 15 for the press-connecting terminals 9 are formed on the surface of the lower case 2.

As shown in FIG. 4, the terminal holder 15 includes a seat 16 for receiving the base plate portion 10 of the press-connecting terminal 9, and a pair of bus bar guide walls 17 and 17 for holding the pair of press-connecting portions 11 and 11 therebetween. A bus bar guide groove 17a is vertically formed in the wall 17. At the lower side of the bottom of the housing 4, a seat 16, surrounding a tab insertion hole 5 (see FIG. 5), is constituted by a positioning projection 16a on which the U-shaped base plate portion 10 of the press-connecting terminal 9 is adapted to be fitted, and a surrounding wall 16b. A press-insertion groove 18 for the press-insertion pieces 14 is provided on one side of the surrounding wall 16b.

FIG. 5 shows a press-connection condition between the press-connecting piece 8 of the bus bar $3_1$ and the press-connecting terminal 9. More specifically, the branch tabs 13 of the press-connecting terminal 9 project through the tab insertion hole 5 of the seat 16 into the housing 4. The base plate portion 10 is inserted in the surrounding wall 16b, and the press-insertion pieces 14 are pressed into the press-insertion groove 18. In this manner, the terminal 9 is fitted in the terminal holder 15. In this condition, the press-connecting piece 8 of the bus bar 3 is inserted in the guide grooves 17a of the pair of bus bar guide walls 17.

When the upper case 1 is put on the lower case 2, the press-connecting piece 8 is press-fitted in and connected to the slots 12 of the press-connecting portions 11 by a pressing projection 19 of the upper case 1. In this manner, the base plate portion 10 and the press-connecting portions 11 of the press-connecting terminal 9 are held fixedly between the pressing projection 19 of the upper case 1 and the seat 16 of the lower case 2 from the upper and lower sides.

The electric connection box shown in FIGS. 3 to 5 is assembled as shown in FIGS. 6A-6D. In FIG. 6A, the press-connecting terminal 9 is attached to the terminal holder 5 on the lower case 2 as described above. In FIG. 6B, the press-connecting piece 8 of the bus bar $3_1$ is held by a chuck 21. Then, as shown in FIG. 6C, the piece 8 is inserted in the guide grooves 17a and 17a of the bus bar guide walls 17 and 17. In the final step shown in FIG. 6D, the upper case 1 is put on the lower case, so that the press-connecting piece 8 is urged by the pressing projection 19 and is press-connected to the press-connecting portions 11 (see FIG. 5).

However, there are occasions when the press-connecting piece 8 held by the chuck 21 in FIG. 6B is displaced right or left from its proper position relative to the bus bar 3 , as shown in FIG. 7A, or the height of the press-connecting piece 8 from the circuit surface of the bus bar 3 is displaced upwardly or downwardly from a proper height h, as shown in FIG. 7B. When such a precision defect is involved, the circuit surface of the bus bar 3 is affected, and therefore is not disposed in registry with its mating bus bar-mounting groove 20, as shown in FIG. 8. As a result, the tab 6 of each bus bar 3 having the press-connecting piece 8 is not in registry with the tab insertion hole 5 in the upper case 1 or the lower case 2, so that the final assembly in FIG. 6D cannot be carried out.

SUMMARY OF THE INVENTION

It is an object of this invention to provide an electric connection box which overcomes the above problems, and is designed to compensate for or absorb a slight precision defect of a press-connecting piece of a bus bar.

The above object has been achieved by an electric connection box wherein a plurality of bus bars having integral upstanding tabs are accommodated within a box body. The tabs are passed through a tab insertion hole in a wall of the box body and are extended into a housing outside of the box body so as to form an insertion portion for a connector, a fuse, or the like.

Bridge-like press-connecting pieces are formed respectively on part of the plurality of bus bars, and are disposed in planes perpendicular to a circuit surface of the bus bars. The electric connection box includes press-connecting terminals each having a base plate portion, tabs formed on one side of the base plate portion, and a bus bar-pressing connecting portion formed on the other side of the base plate portion and having a U-shaped slot. Terminal holders for the press-connecting terminals are formed on an inner surface of the box body. An insulative board has bus bar-mounting grooves arranged in a pattern corresponding to a pattern of arrangement of the plurality of bus bars, and has throughholes for the terminal holders, the terminal holder being constituted by a pair of bus bar guide walls each having a bus bar guide groove.

The base plate is fixed by passing each of the tabs of the press-connecting terminals into the housing through a tab insertion hole of the terminal holder. A bus bar circuit board, having the plurality of bus bars fixedly mounted in the bus bar-mounting grooves of the insulative board, is placed on the inner surface of the box body, so that the terminal holder is projected through the through hole. The press-connecting piece is inserted into the guide grooves in the bus bar guide walls, and is press-fitted in and connected to the U-shaped slots of the press-connecting terminal.

In the present invention, the terminal holders for the press-connecting terminals and the member for mounting the plurality of bus bars thereon are provided on the separate base members, respectively.

More specifically, the terminal holders are formed on the inner surface of one of the lower and upper cases of the box body, and the insulative board has the through holes for the terminal holders, as well as the bus bar-mounting grooves arranged in a pattern corresponding to the circuit pattern of the bus bars. Therefore, after the bus bars are fixed in the bus bar-mounting grooves, the insulative board is placed, for example, on the lower case, and through the guide grooves of the bus bar guide walls, the press-connecting piece need only to be press-fitted in and connected to the press-connecting terminal in the terminal holder projecting upwardly through the through hole. At this time, since a slight precision defect of the press-connecting piece is absorbed or rectified, assembly efficiency is improved.

BRIEF DESCRIPTION OF THE DRAWINGS

FIGS. 2A–2E are views illustrative of steps of assembling the electric connection box;

FIG. 5 is a cross-sectional view showing the press-connecting condition of FIG. 4;

FIGS. 7A and 7B are views respectively showing precision defects with respect to the circuit surface of the bus bar; and FIG. 8 is a view illustrative of an improper mounting condition of the bus bar when the precision defect of FIG. 7 is involved.

DETAILED DESCRIPTION OF THE PREFERRED EMBODIMENT

The above construction and operation will now be specifically described with reference to the drawings showing a preferred embodiment of the invention.

Figure 1:
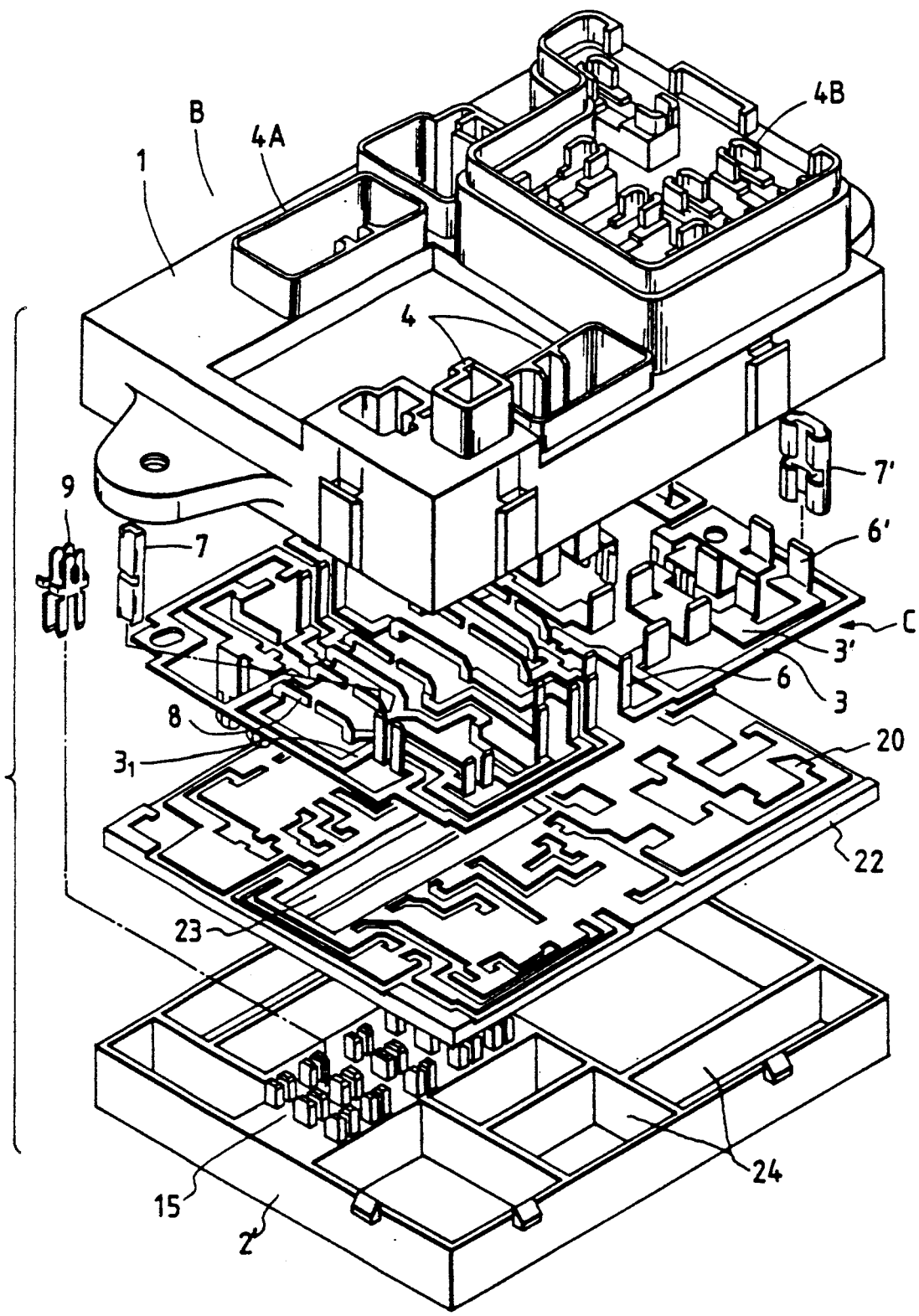
FIG. 1 is an exploded, perspective view of a preferred embodiment of an electric connection box according to the present invention.
Figure 3:
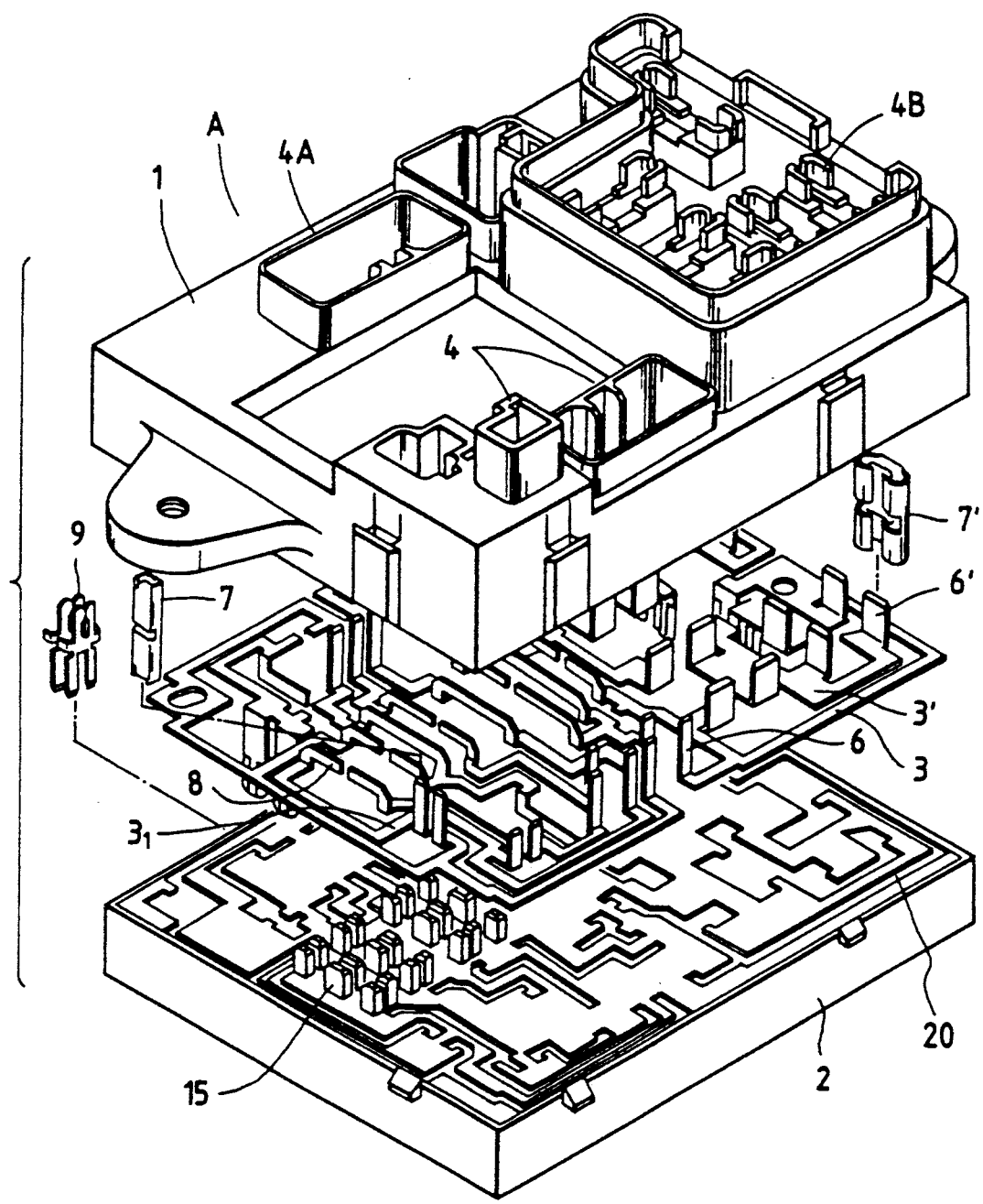
FIG. 3 is an exploded, perspective view of an electric connection box of the type shown in the abovementioned copending application.
Figure 4:
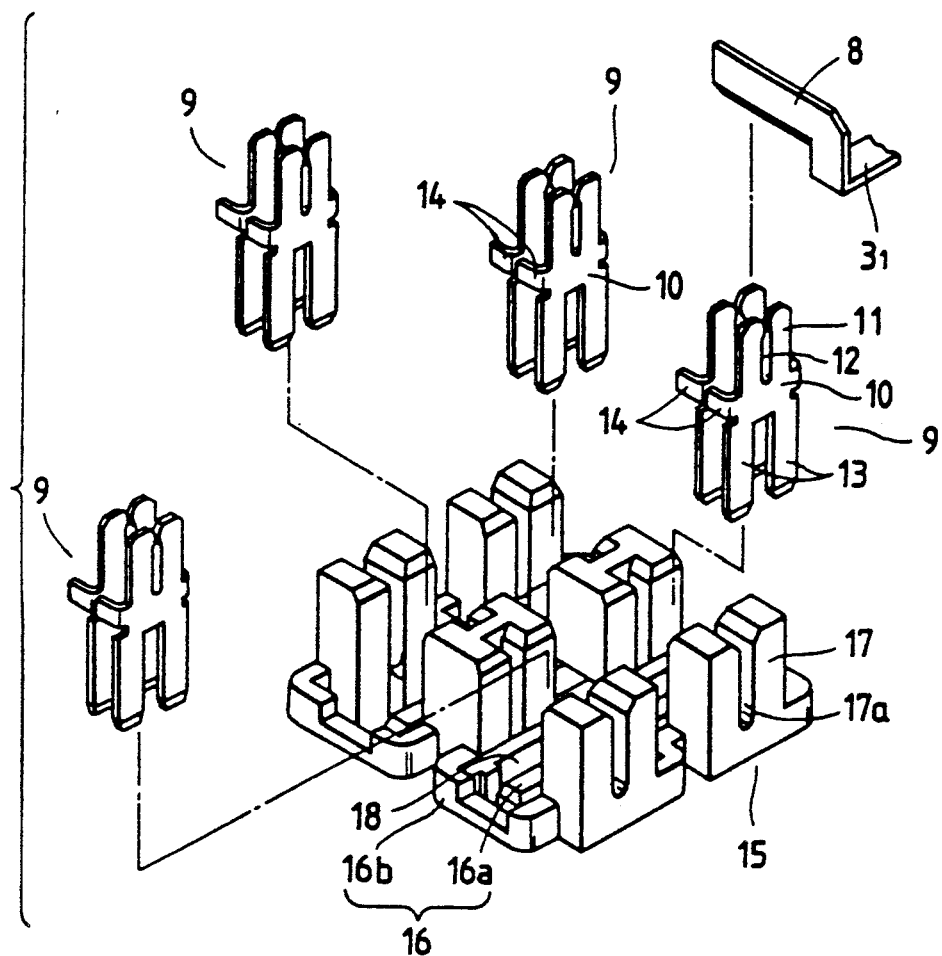
FIG. 4 is an enlarged, perspective view showing a branch press-connecting terminal 9, a terminal holder and a press-connecting piece 8 in FIG. 3.
Figure 6A:
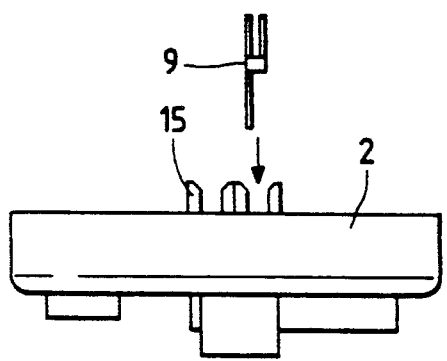
FIGS. 6A–6D are a view illustrative of steps of assembling the electric connection box of FIG. 3.
Figure 6B:
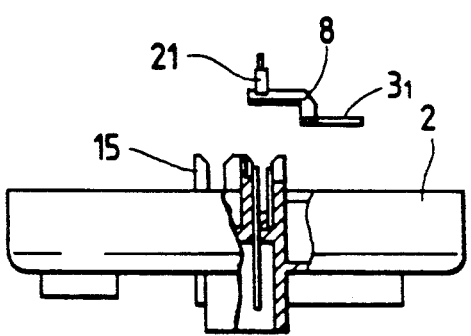
Figure 6C:
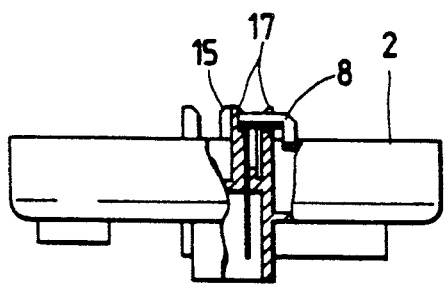
Figure 6D:
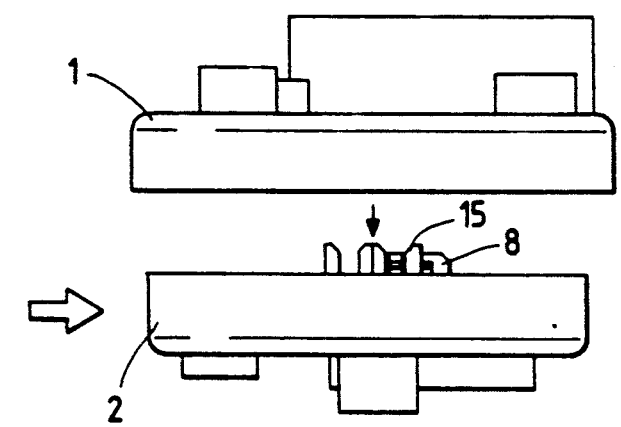

FIG. 1 is an exploded, perspective view of an electric connection box provided in accordance with the present invention, and FIGS. 2A to 2E show the steps of assembling the inventive electric connection box. Parts identical to those shown in FIGS. 3 to 5 are designated by identical reference numerals, and a detailed explanation thereof will be omitted here, as it is provided in Application No. 07/534,564, now U.S. Pat. No. 5,011,417.

In FIG. 1, an upper case 1 and a lower case 2' of an electric connection box B accommodate a bus bar circuit board C which is constituted by an insulative board 22 having a plurality of bus bars 3 (3' and $3_1$) mounted thereon. The electric connection box B also includes necessary relay terminals 7 and 7' and branch press-connecting terminals 9.

A plurality of bus bar-mounting grooves 20, formed in the insulative board 22, are arranged in a pattern corresponding to the pattern of arrangement of the bus bars 3 (3' and $3_1$). The insulative board 22 has through holes 23 for a plurality of terminal holders 15 formed on the lower case 2'.

The terminal holder 15 on the lower case 1' is identical in construction to that shown in FIG. 4, and therefore a detailed explanation thereof will be omitted here. Ventilation cooling openings 24 are formed in the lower case 2'.

The electric connection box B constructed as above is assembled in the sequence shown in FIGS. 2A–2E. In FIG. 2A, the bus bars 3 (3 and $3_1$) are pressed relative to, and are mounted fixedly in the bus bar-mounting grooves 20 in the insulative board 22, using a pressing jig (not shown), thereby assembling the bus bar circuit board C.

In FIG. 2B, the press-connecting terminal 9 is attached to the terminal holder 15 on the lower case 1' in a manner described above. In FIGS. 2C and 2D, a press-connecting piece 8 of the bus bar $3_1$ is held by a chuck 21. In this condition, the bus bar circuit board C is placed on the lower case 2, The press-connecting piece 8 is inserted in guide grooves 17a and 17a of a pair of bus bar guide walls 17 and 17 of the terminal holder 15 which projects upwardly through the through hole 23 in the insulative board 22.

At the time of insertion of the press-connecting piece 8 into the guide grooves 17a and 17a, even if the piece 8 has a precision defect of the type shown in FIGS. 7A or 7B, there is no possibility that the piece 8 will fail to be inserted in the guide grooves 17a, because the bus bar $3_1$ already has been press-fitted in and fixed to the bus bar-mounting groove 20. The press-connecting piece 8 is just about to be press-fitted in U-shaped slots 12 of press-connecting portions 11 of the branch press-connecting terminal 9 through the guide grooves 17a.

In FIG. 2E, the upper case 1 is placed on and urged against the lower case, so that a pressing projection 19 urges the press-connecting piece 8 into the U-shaped slots 12 as described above, thereby achieving a press-connection.

Thus, each of the bus bars 3 and 3' (particularly, the bus bar $3_1$ having the press-connecting piece 8) is mounted fixedly beforehand relative to the bus bar-mounting groove 20 of the insulative board 22 by press-fitting. Therefore, even if the press-connecting piece 8 has a precision defect, it can be rectified or absorbed suitably by the insertion of the piece 8 into the bus bar guide grooves 17a and by the press-fitting of the piece 8 into the U-shaped slots 12 by the pressing projection 19. Therefore, assembly of the electric connection box can be carried out smoothly.

As described above, in the present invention, in the assembly of the electric connection box using the bus bar, having the bridge-like press-connecting piece disposed perpendicular to the circuit surface, and the press-connecting terminal having the bus bar press-connecting portion, the bus bar is fixed beforehand to the bus bar-mounting groove in the insulative board. As a result, even if the press-connecting piece has a slight precision defect such as bending and displacement of position, it can be absorbed or rectified suitably when the press-connecting piece is inserted into the guide grooves of the bus bar guide walls of the terminal holder. Therefore, assembly of the electric connection box can be carried out smoothly.

While the invention has been described in detail above with reference to a preferred embodiment, various modifications within the scope and spirit of the invention will be apparent to people of working skill in this technological field. Thus, the invention should be considered as limited only by the scope of the appended claims.

What is claimed is:

1. In an electric connection box comprising a housing, a box-shaped body, a plurality of bus bars having integral upstanding tabs accommodated within said body, said tabs passing through a tab insertion hole in a wall of said body and extending into said housing outside of said body so as to form an insertion portion for an electrical connector, the improvement comprising:
   bridge-like press-connecting pieces, formed respectively on a portion of said plurality of bus bars, and disposed in planes perpendicular to a circuit surface of said bus bars;
   a plurality of press-connecting terminals, each having a base plate portion, tabs formed on one side of said base plate portion, and a bus bar-pressing connecting portion formed on the other side of said base plate portion and having a U-shaped slot;
   terminal holders for said press-connecting terminals, said terminal holders being formed on an inner surface of said body and comprising a pair of bus bar guide walls each having a bus bar guide groove; and
   an insulative board having bus bar-mounting grooves arranged in a pattern corresponding to a pattern of arrangement of said plurality of bus bars, and having through holes for said terminal holders;
   said base plate portion being fixed by passing each of said tabs of said press-connecting terminal into said housing through a tab insertion hole of said terminal holder;
   said electric connection box further including a bus bar circuit board, said plurality of bus bars being mounted fixedly in said bus bar-mounting grooves of said insulative board, said bus bar circuit board being placed on the inner surface of said body, so that said terminal holder is projected through said through hole; and
   wherein said press-connecting piece is inserted into said guide grooves in said bus bar guide walls, and is press-fitted in and connected to said U-shaped slots of said press-connecting terminal.

* * * * *